US012700711B2

(12) United States Patent
Fujihara

(10) Patent No.: US 12,700,711 B2
(45) Date of Patent: Aug. 4, 2026

(54) LASER IRRADIATION HEAD AND LASER IRRADIATION DEVICE

(71) Applicant: HAMAMATSU PHOTONICS K.K., Hamamatsu (JP)

(72) Inventor: Atsushi Fujihara, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 542 days.

(21) Appl. No.: 18/026,944

(22) PCT Filed: Aug. 31, 2021

(86) PCT No.: PCT/JP2021/031876
§ 371 (c)(1),
(2) Date: Mar. 17, 2023

(87) PCT Pub. No.: WO2022/064971
PCT Pub. Date: Mar. 31, 2022

(65) Prior Publication Data
US 2023/0261434 A1      Aug. 17, 2023

(30) Foreign Application Priority Data

Sep. 23, 2020     (JP) ................................. 2020-158393

(51) Int. Cl.
*H01S 5/024*            (2006.01)
*H01S 5/02253*          (2021.01)

(52) U.S. Cl.
CPC ...... *H01S 5/02423* (2013.01); *H01S 5/02253* (2021.01); *H01S 5/02415* (2013.01); *H01S 5/02469* (2013.01)

(58) Field of Classification Search
CPC ............. H01S 5/02253; H01S 5/02469; H01S 5/2423; H01S 3/0407
See application file for complete search history.

(56) References Cited

U.S. PATENT DOCUMENTS

| | | |
|---|---|---|
| 2002/0162338 A1 | 11/2002 | Shimada et al. |
| 2008/0095204 A1 | 4/2008 | Miyajima et al. |
| (Continued) | | |

FOREIGN PATENT DOCUMENTS

| | | |
|---|---|---|
| CN | 1459899 A | 12/2003 |
| CN | 1591699 A | 3/2005 |
| (Continued) | | |

OTHER PUBLICATIONS

International Preliminary Report on Patentability mailed Apr. 6, 2023 for PCT/JP2021/031876.
(Continued)

*Primary Examiner* — Michael Carter
(74) *Attorney, Agent, or Firm* — Faegre Drinker Biddle & Reath LLP

(57)      ABSTRACT

A laser irradiation head includes: a semiconductor laser module including a semiconductor laser element and a lens; a heat sink having a flow path of a refrigerant; and a first pipe connector that a first pipe for supplying the refrigerant to the flow path is attachable to and detachable from. The heat sink has an outer surface including a first area and a second area being in a relationship of intersecting with the first area, the semiconductor laser module is screwed to the heat sink in the first area, and the first pipe connector is screwed to the heat sink in the second area.

12 Claims, 13 Drawing Sheets

(56)  References Cited

U.S. PATENT DOCUMENTS

| | | | | |
|---|---|---|---|---|
| 2010/0118902 A1* | 5/2010 | Wu | ........................ | H01S 5/0233 |
| | | | | 372/36 |
| 2015/0237767 A1* | 8/2015 | Shedd | ........................ | F28F 3/12 |
| | | | | 165/104.31 |
| 2018/0342854 A1* | 11/2018 | Shang | ................... | H01S 5/4012 |
| 2019/0044303 A1* | 2/2019 | Morita | ................. | H01S 5/0235 |

FOREIGN PATENT DOCUMENTS

| CN | 1906821 A | 1/2007 |
|---|---|---|
| CN | 107112220 A | 8/2017 |
| CN | 108701960 A | 10/2018 |
| CN | 109244052 A | 1/2019 |
| CN | 208677570 U | 4/2019 |
| CN | 209693337 U | 11/2019 |
| CN | 110809841 A | 2/2020 |
| CN | 21079762 U | 4/2020 |
| DE | 3601140 A1 | 7/1987 |
| JP | H11-220191 A | 8/1999 |
| JP | 2004-228432 A | 8/2004 |
| JP | 2006-339569 A | 12/2006 |
| JP | 2013-089733 A | 5/2013 |
| WO | WO-2016/063814 A1 | 4/2016 |
| WO | WO-2019/009086 A1 | 1/2019 |
| WO | WO-2019/225128 A1 | 11/2019 |

OTHER PUBLICATIONS

Office Action dated Apr. 22, 2025 that issued in GB Patent Application No. 2303210.5.

* cited by examiner

LASER IRRADIATION HEAD AND LASER IRRADIATION DEVICE

TECHNICAL FIELD

The present disclosure relates to a laser irradiation head and a laser irradiation device.

BACKGROUND ART

Patent Literature 1 describes that in a laser device including a semiconductor laser and a cooling jacket, the semiconductor laser is installed at a predetermined position on the cooling jacket via a heat transfer adhesive agent.

CITATION LIST

Patent Literature

Patent Literature 1: Japanese Unexamined Patent Publication No. 2006-339569

SUMMARY OF INVENTION

Technical Problem

In the case where the laser device described in Patent Literature 1 is attached to a moving mechanism such as a robot arm and is used as a laser irradiation head, when the adhesive agent deteriorates, the semiconductor laser unexpectedly falls off from the predetermined position on the cooling jacket. Namely, the laser device described in Patent Literature 1 is not suitable for applications in which the laser device is attached to the moving mechanism and is used.

An object of the present disclosure is to provide a laser irradiation head suitable for applications in which the laser irradiation head is attached to a moving mechanism and is used, and a laser irradiation device including such a laser irradiation head.

Solution to Problem

According to one aspect of the present disclosure, there is provided a laser irradiation head including: a semiconductor laser module including a semiconductor laser element and a lens; a heat sink having a flow path of a refrigerant; and a first pipe connector that a first pipe for supplying the refrigerant to the flow path is attachable to and detachable from. The heat sink has an outer surface including a first area and a second area being in a relationship of intersecting with the first area, the semiconductor laser module is screwed to the heat sink in the first area, and the first pipe connector is screwed to the heat sink in the second area.

In the laser irradiation head, the semiconductor laser module and the first pipe connector are screwed to the heat sink. Accordingly, when the laser irradiation head is attached to a moving mechanism such as a robot arm and is used, the semiconductor laser module and the first pipe connector can be prevented from unexpectedly falling off from the heat sink. Further, the second area in which the first pipe connector is screwed to the heat sink is in a relationship of intersecting with the first area in which the semiconductor laser module is screwed to the heat sink. Accordingly, it is possible to spatially efficiently dispose the semiconductor laser module and the first pipe connector on the heat sink while reducing the size of the heat sink. As described above, the laser irradiation head is suitable for applications in which the laser irradiation head is attached to the moving mechanism and is used.

The laser irradiation head according to one aspect of the present disclosure may further include a second pipe connector that a second pipe for discharging the refrigerant from the flow path is attachable to and detachable from, and the second pipe connector may be screwed to the heat sink in the second area. According to this aspect, when the laser irradiation head is attached to the moving mechanism such as a robot arm and is used, the second pipe connector can be prevented from unexpectedly falling off from the heat sink. Further, it is possible to spatially efficiently dispose the semiconductor laser module, the first pipe connector, and the second pipe connector on the heat sink while reducing the size of the heat sink.

In the laser irradiation head according to one aspect of the present disclosure, the heat sink may include a body portion having the first area and the second area, and a lid portion, the body portion may have a recessed portion including the flow path and opening opposite the first area, and the lid portion may be attached to the body portion to close an opening portion of the recessed portion. According to this aspect, maintenance of the flow path can be performed in a state where the semiconductor laser module and the first pipe connector are screwed to the body portion of the heat sink.

In the laser irradiation head according to one aspect of the present disclosure, the body portion may include a bottom wall portion and a side wall portion defining the recessed portion, and a protrusion portion protruding from the bottom wall portion into the recessed portion, and the bottom wall portion, the side wall portion, and the protrusion portion may be integrally formed. According to this aspect, since heat is easily transferred between the bottom wall portion, the side wall portion, and the protrusion portions, the cooling effect of the semiconductor laser module screwed to the body portion can be improved.

In the laser irradiation head according to one aspect of the present disclosure, the semiconductor laser module may be screwed to the side wall portion in the first area. According to this aspect, the stability of the screwing of the semiconductor laser module to the body portion can be improved.

In the laser irradiation head according to one aspect of the present disclosure, the semiconductor laser module may further include a housing accommodating the semiconductor laser element, and a support member supporting the lens. According to this aspect, the degree of freedom in designing the lens with respect to the semiconductor laser element can be improved.

The laser irradiation head according to one aspect of the present disclosure may further include an installation member disposed between the heat sink and the semiconductor laser module, and the housing and the support member may be screwed to the heat sink in the first area with the installation member interposed therebetween. According to this aspect, for example, compared to a configuration in which the housing and the support member are disposed as separate members, it is possible to easily and accurately align an optical axis of the semiconductor laser element and an optical axis of the lens with each other.

In the laser irradiation head according to one aspect of the present disclosure, the installation member may have a first surface and a second surface parallel to the first area, the second surface may be located at a lower position than the first surface, the housing may be disposed on the first surface, and the support member may be disposed on the second surface. According to this aspect, for example, when the size of the lens is large, it is possible to easily and accurately align the optical axis of the semiconductor laser element and the optical axis of the lens with each other.

The laser irradiation head according to one aspect of the present disclosure may further include a Peltier element disposed between the heat sink and the installation member. According to this aspect, by releasing heat from the Peltier element to the heat sink, the semiconductor laser module can be cooled such that the temperature of the semiconductor laser element becomes constant.

In the laser irradiation head according to one aspect of the present disclosure, the housing and the support member may be directly screwed to the heat sink in the first area. According to this aspect, for example, compared to the configuration in which the housing and the support member are disposed as separate members, it is possible to easily and accurately align the optical axis of the semiconductor laser element and the optical axis of the lens with each other while simplifying the structure.

In the laser irradiation head according to one aspect of the present disclosure, the heat sink may have a third surface and a fourth surface being the first area, the fourth surface may be located at a lower position than the third surface, the housing may be disposed on the third surface, and the support member may be disposed on the fourth surface. According to this aspect, for example, when the size of the lens is large, it is possible to easily and accurately align the optical axis of the semiconductor laser element and the optical axis of the lens with each other.

According to one aspect of the present disclosure, there is provided a laser irradiation device including: the laser irradiation head; the first pipe having flexibility and connected to the first pipe connector; a refrigerant supply source configured to supply the refrigerant to the flow path through the first pipe; and a moving mechanism configured to move the laser irradiation head.

According to the laser irradiation device, it is possible to realize suitable laser irradiation.

Advantageous Effects of Invention

According to the present disclosure, it is possible to provide the laser irradiation head suitable for applications in which the laser irradiation head is attached to the moving mechanism and is used, and the laser irradiation device including such a laser irradiation head.

BRIEF DESCRIPTION OF DRAWINGS

FIG. 9 is a plan view of the laser irradiation device of the modification example.

FIG. 11 is a plan view of a heat sink of a modification example.

DESCRIPTION OF EMBODIMENTS

Figure 1:
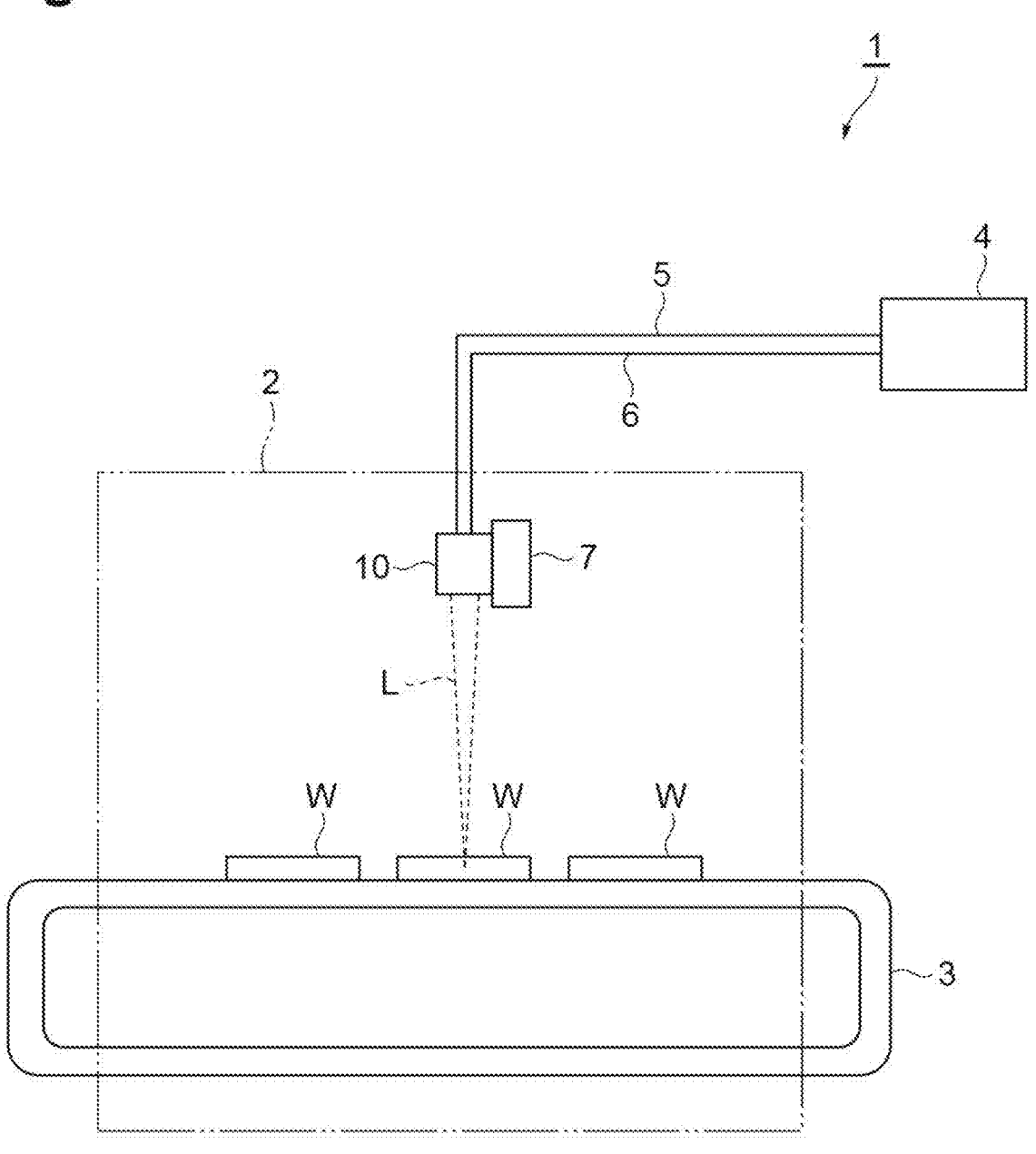
FIG. 1 is a configuration view of a laser irradiation device of one embodiment.

Hereinafter, an embodiment of the present disclosure will be described in detail with reference to the drawings. Incidentally, in the drawings, the same or equivalent portions are denoted by the same reference signs, and duplicate descriptions will be omitted.

As illustrated in FIG. 1, a laser irradiation device 1 includes a housing 2, a support portion 3, a refrigerant supply source 4; a first pipe 5, a second pipe 6, a moving mechanism 7, and a laser irradiation head 10. The support portion 3 supports a plurality of workpieces W inside the housing 2. The refrigerant supply source 4 supplies a refrigerant to the laser irradiation head 10 (flow path 24 of a heat sink 11) through the first pipe 5, and discharges the refrigerant from the laser irradiation head through the second pipe 6. The refrigerant supply source 4 is, for example, a pump that pressurizes and sends air that is a refrigerant. The moving mechanism 7 moves the laser irradiation head 10 inside the housing 2. The moving mechanism 7 is, for example, a robot arm or a three-dimension stage. In the present embodiment, the laser irradiation device 1 is a laser processing device, and performs heat processing (for example, soldering, resin welding, preheating, or the like) on each workpiece W by irradiating each workpiece W with laser light L emitted from the laser irradiation head 10.

Figure 2:
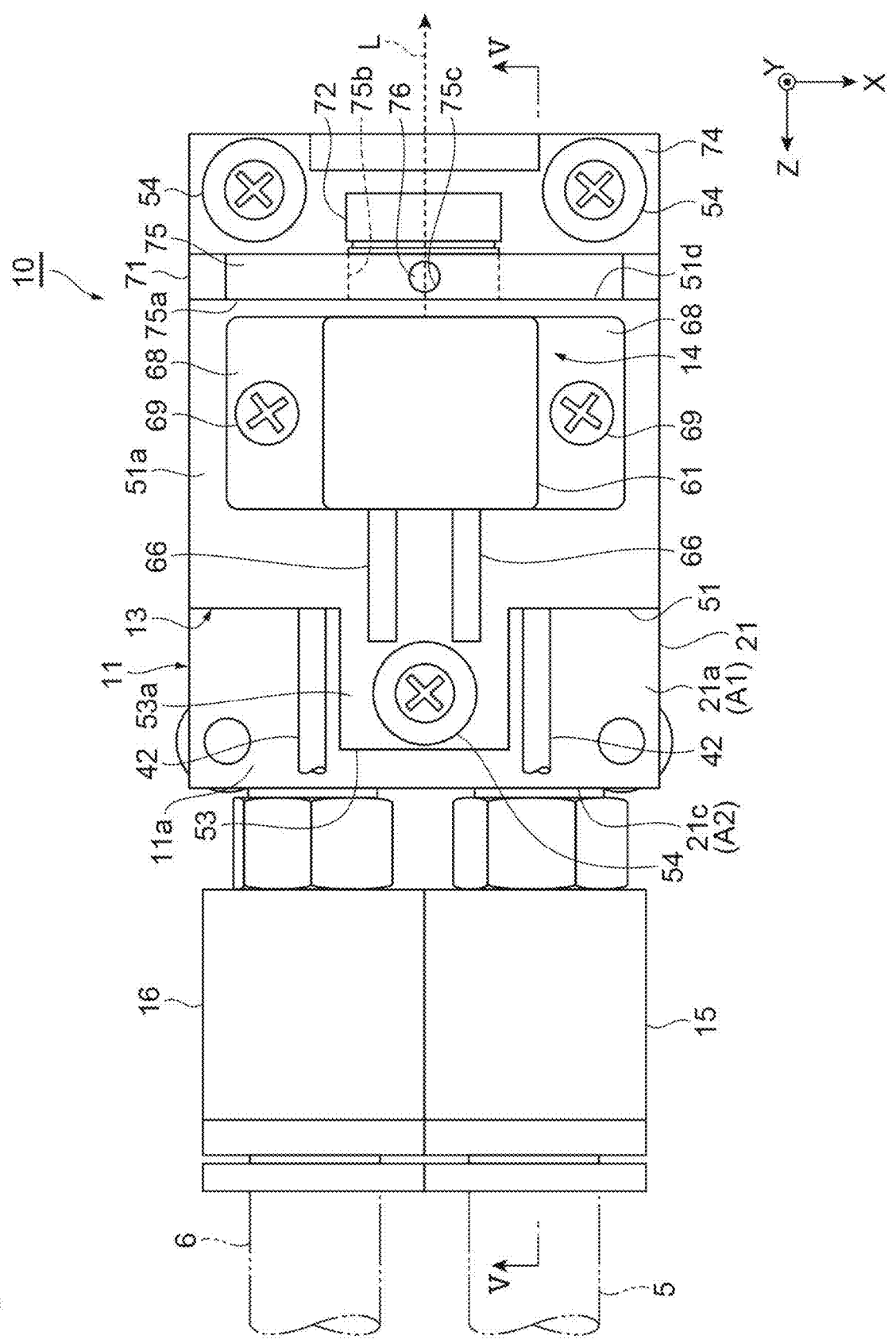
FIG. 2 is a plan view of the laser irradiation device illustrated in FIG. 1.
Figure 3:
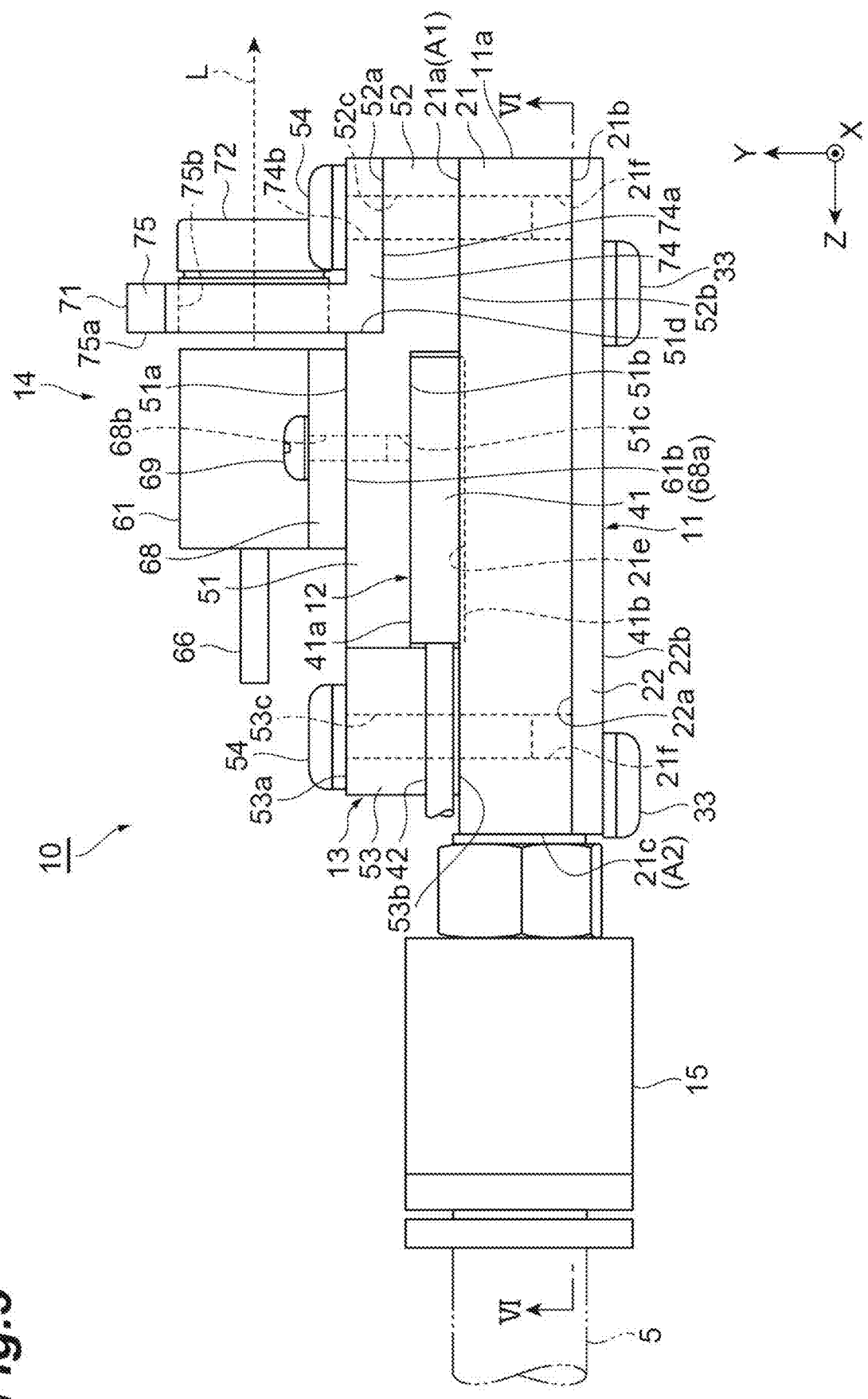
FIG. 3 is a side view of the laser irradiation device illustrated in FIG. 2.
Figure 4:
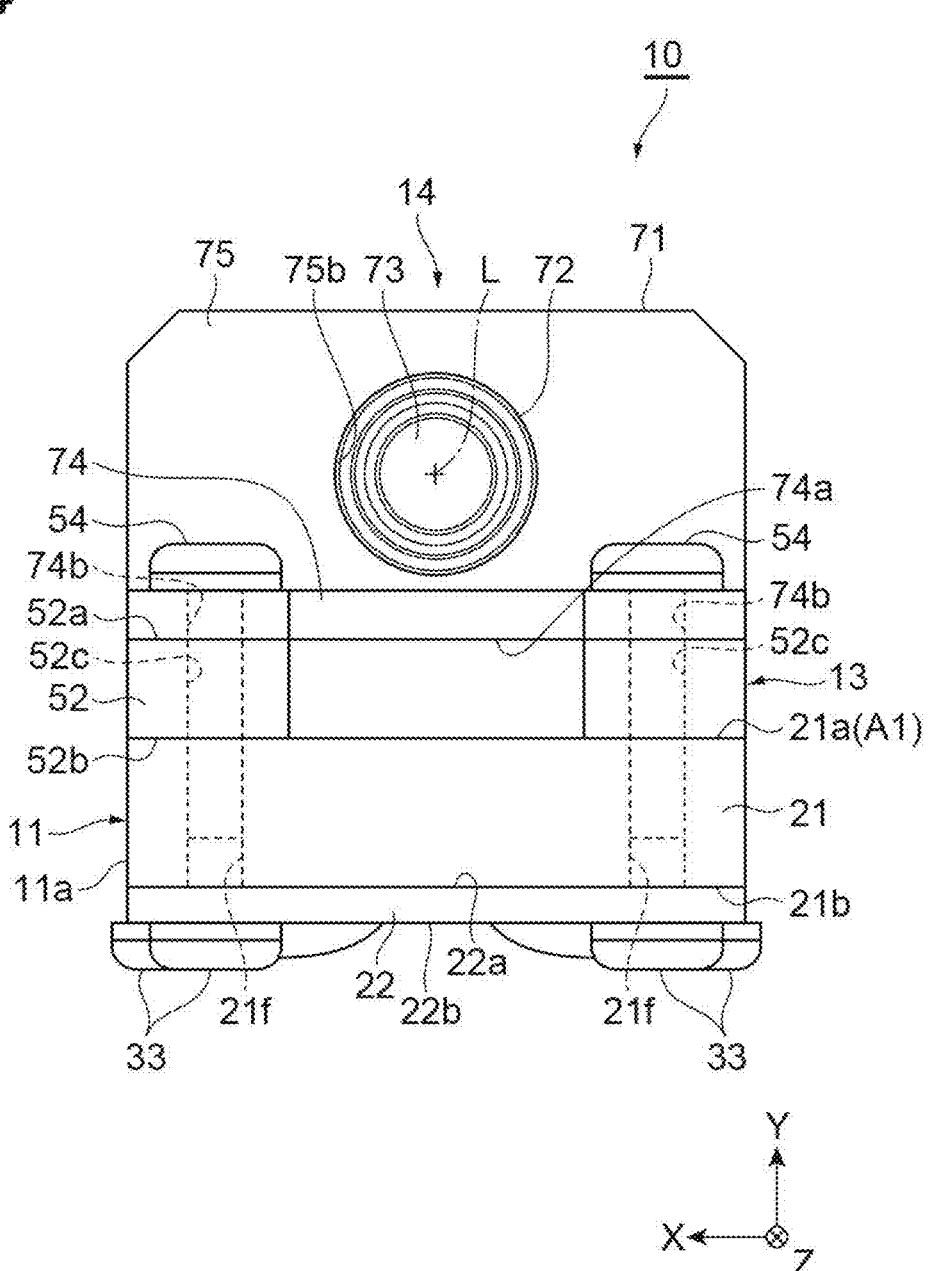
FIG. 4 is a front view of the laser irradiation device illustrated in FIG. 2.

As illustrated in FIGS. 2 to 4, the laser irradiation head 10 includes the heat sink 11, a Peltier element 12, an installation member 13, a semiconductor laser module 14, a first pipe connector 15, and a second pipe connector 16. The heat sink 11, the Peltier element 12, the installation member 13, and the semiconductor laser module 14 are covered by, for example, a cover (not illustrated) formed in a rectangular parallelepiped box shape. Hereinafter, a direction parallel to an emission direction of the laser light L is referred to as a Z-axis direction, a direction perpendicular to the Z-axis direction is referred to as an X-axis direction, and a direction perpendicular to both the Z-axis direction and the X-axis direction is referred to as a Y-axis direction. In addition, a side from which the laser light L is emitted is referred to as a front side, and an opposite side is referred to as a rear side.

The heat sink 11 includes a body portion 21 and a lid portion 22. The body portion 21 has a surface 21a and a back surface 21b perpendicular to the Y-axis direction, and a rear surface 21c perpendicular to the Z-axis direction. The rear surface 21c is a surface on an opposite side of the body portion 21 from a recessed portion 23. The body portion 21 is, for example, formed in a rectangular parallelepiped shape by aluminum. The lid portion 22 has a surface 22a and a back surface 22b perpendicular to the Y-axis direction. The surface 22a of the lid portion 22 is in contact with the back surface 21b of the body portion 21. The lid portion 22 is, for example, formed in a rectangular plate shape by aluminum. As one example, when viewed in the Y-axis direction, an outer edge of the lid portion 22 coincides with an outer edge of the body portion 21.

In the present embodiment, the surface 21a of the body portion 21 is a first area A1 of an outer surface 11a of the heat sink 11, and the rear surface 21c of the body portion 21 is a second area A2 of the outer surface 11a of the heat sink 11. Namely, the body portion 21 has the first area A1 and the second area A2. In the present embodiment, the second area A2 is orthogonal to (namely, perpendicularly intersects with) the first area A1. However, it is good as long as the second area A2 is in a relationship of intersecting with the first area A1. Incidentally, the second area A2 being in a relationship of intersecting with the first area A1 means that "the surface including the second area A2" intersects with "the surface including the first area A1" (not limited to intersecting with each other).

Figure 5:
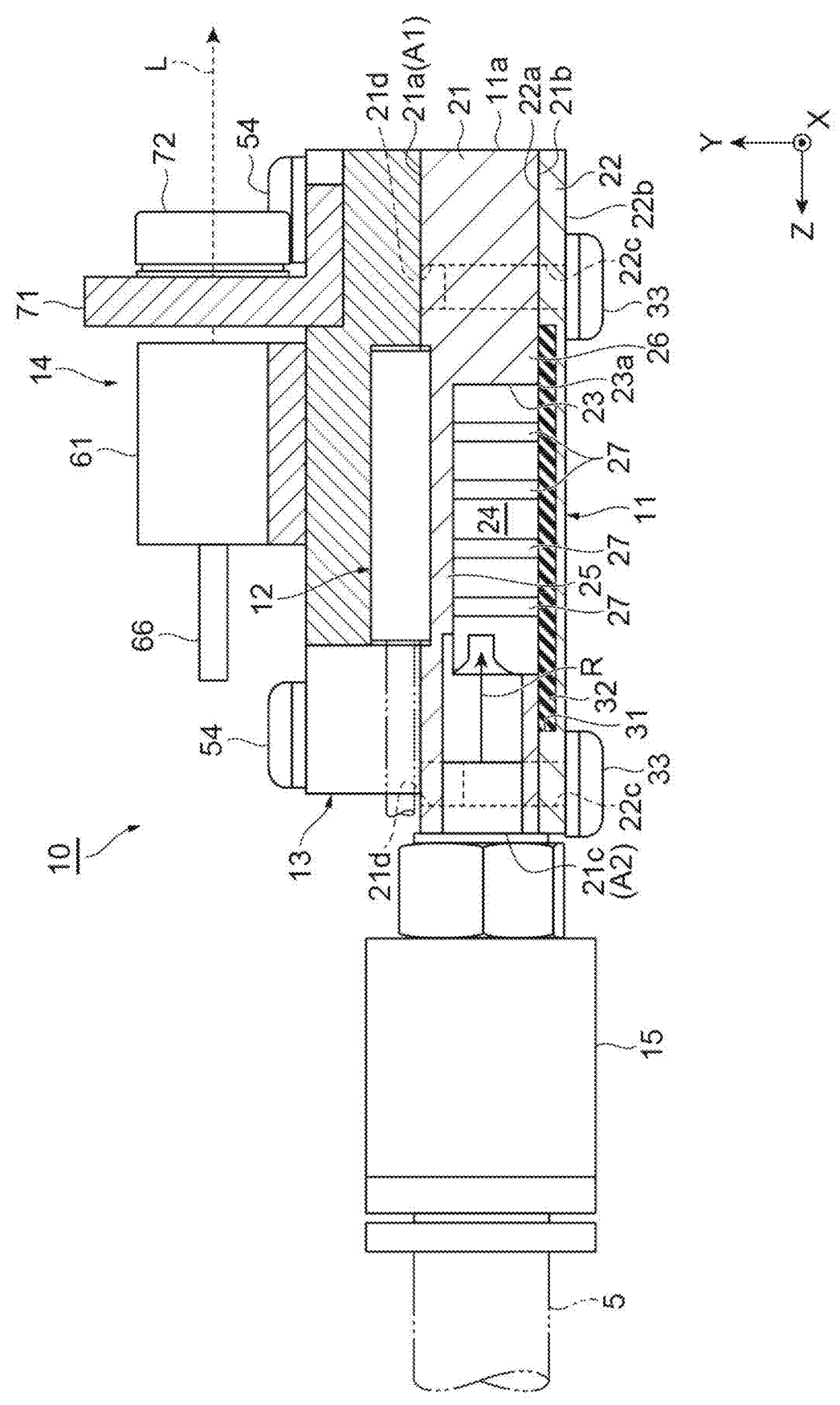
FIG. 5 is a cross-sectional view of the laser irradiation device taken along line V-V illustrated in FIG. 2.
Figure 6:
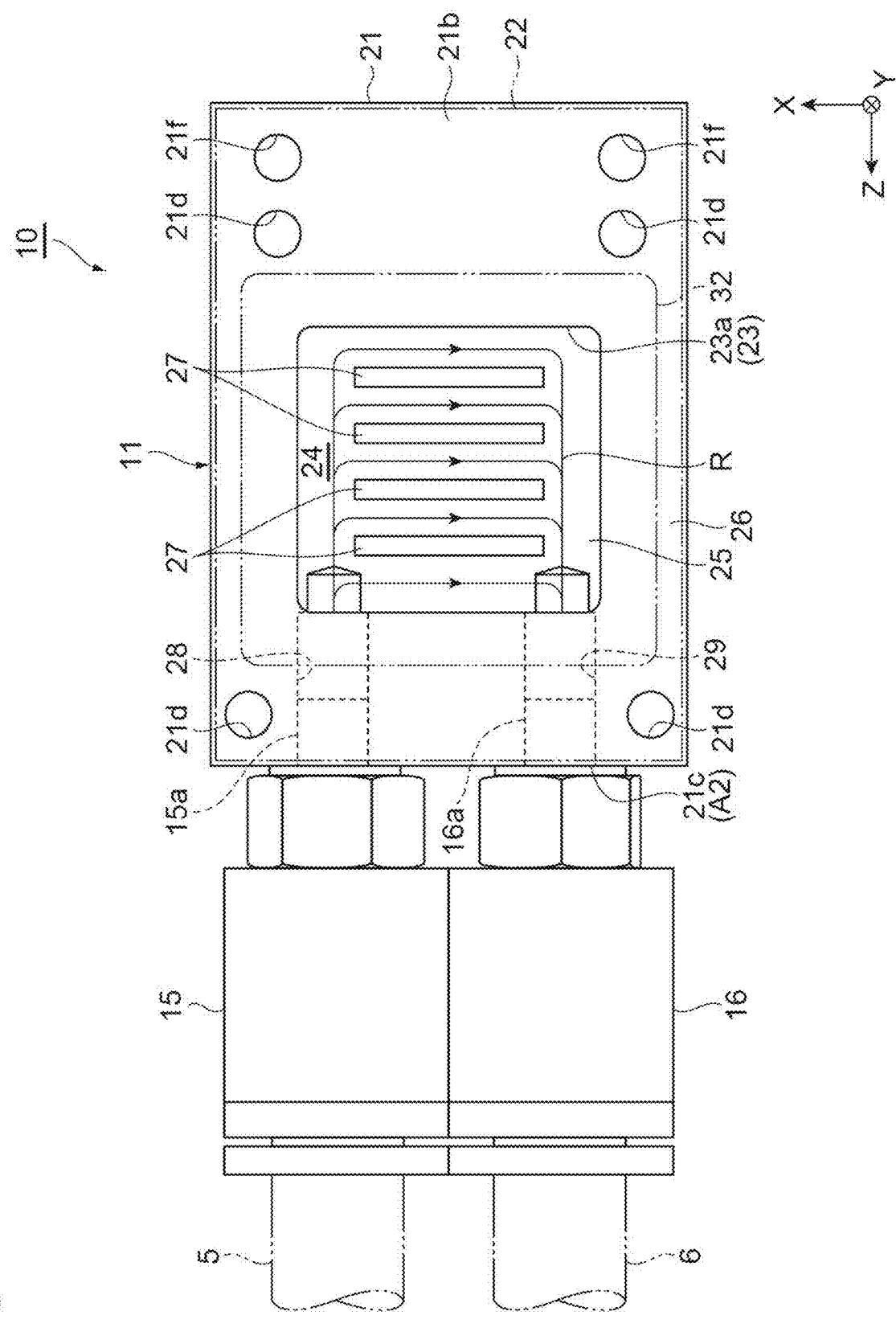
FIG. 6 is a cross-sectional view of the laser irradiation device taken along line VI-VI illustrated in FIG. 3.

As illustrated in FIGS. 5 and 6, the body portion 21 includes the recessed portion 23. The recessed portion 23 is formed in the back surface 21b, and opens opposite the first area A1. The recessed portion 23 includes the flow path 24 of a refrigerant R, which is provided in the heat sink 11. In the present embodiment, the refrigerant R is pressurized and sent from the refrigerant supply source 4 (refer to FIG. 1).

The body portion 21 includes a bottom wall portion 25, a side wall portion 26, and a plurality of protrusion portions 27. The bottom wall portion 25, the side wall portion 26, and the plurality of protrusion portions 27 are integrally formed. The bottom wall portion 25 and the side wall portion 26 define the recessed portion 23. Namely, the bottom wall portion 25 faces an opening portion 23a of the recessed portion 23 in the Y-axis direction, and the side wall portion 26 surrounds the recessed portion 23 when viewed in the Y-axis direction. The plurality of protrusion portions 27 protrude from the bottom wall portion 25 into the recessed portion 23. In the present embodiment, the plurality of protrusion portions 27 are provided side by side in the Z-axis direction in a state where each protrusion portion 27 extends in the X-axis direction. As one example, a position (position in the Y-axis direction) of an end surface on an opposite side of each protrusion portion 27 from the bottom wall portion 25 is the same as a position in the Y-axis direction of the back surface 21b.

The body portion 21 has a supply port 28 and a discharge port 29 for the refrigerant R. The supply port 28 is formed in a portion on a second area A2 side of the side wall portion 26 so as to open to the second area A2 and to an inner surface of the recessed portion 23. Similarly, the discharge port 29 is formed in a portion on the second area A2 side of the side wall portion 26 so as to open to the second area A2 and to the inner surface of the recessed portion 23. The supply port 28 and the discharge port 29 are provided side by side in the X-axis direction in a state where each of the supply port 28 and the discharge port 29 extends in the Z-axis direction.

The lid portion 22 includes a recessed portion 31. The recessed portion 31 is formed in the surface 22a. When viewed in the Y-axis direction, an outer edge of the recessed portion 31 is located outside an outer edge of the opening portion 23a of the recessed portion 23. A rubber sheet 32 is disposed on the recessed portion 31. When viewed in the Y-axis direction, an outer edge of the rubber sheet 32 coincides with the outer edge of the recessed portion 31. When the rubber sheet 32 exists as a single body, a thickness of the rubber sheet 32 is larger than a depth of the recessed portion 31. The lid portion 22 is attached to the body portion 21 to close the opening portion 23a of the recessed portion 23 in a state where the rubber sheet 32 is disposed on the recessed portion 31. The lid portion 22 is screwed to the body portion 21 on the back surface 21b. In the present embodiment, a plurality of screw holes 21d are formed in the body portion 21 so as to open to at least the back surface 21b, and a plurality of clearance holes 22c are formed in the lid portion 22 so as to correspond to the plurality of screw holes 21d. The lid portion 22 is attached to the body portion 21 by screwing a bolt 33 from a back surface 22b side through one of the clearance holes 22c into one of the screw holes 21d.

In the heat sink 11, a peripheral portion of the opening portion 23a of the back surface 21b of the body portion 21 is in close contact with the rubber sheet 32. Accordingly, the refrigerant R is prevented from leaking from the flow path 24. In the present embodiment, an end surface on an opposite side of each protrusion portion 27 from the bottom wall portion 25 is also in close contact with the rubber sheet 32. Incidentally, a groove extending to surround the opening portion 23a when viewed in the Y-axis direction may be formed in the surface 22a of the lid portion 22, and an O-ring may be disposed in the groove. Even in that case, the refrigerant R can be prevented from leakage from the flow path 24.

The first pipe connector 15 is screwed to the heat sink 11 in the second area A2. In the present embodiment, a female screw is formed on an inner peripheral surface of the supply port 28 of the body portion 21, and a male screw is formed on an outer peripheral surface of one end portion 15a of the first pipe connector 15. The first pipe connector is attached to the body portion 21 by screwing the one end portion 15a from the rear side into the supply port 28. The first pipe 5 for supplying the refrigerant R to the flow path 24 is connected to the first pipe connector 15. The first pipe connector 15 is a connector that the first pipe 5 is attachable to and detachable from. The first pipe 5 has flexibility. The material of the first pipe 5 is, for example, nylon, polyurethane, fluorine resin, or the like. In the present embodiment, the first pipe connector 15 is a connector that an end portion (end portion having flexibility) on a first pipe connector 15 side of the first pipe 5 is attachable to and detachable from. Incidentally, the end portion on the first pipe connector 15 side of the first pipe 5 may be provided with a connection portion that is attachable to and detachable from the first pipe connector 15.

The second pipe connector 16 is screwed to the heat sink 11 in the second area A2. In the present embodiment, a female screw is formed on an inner peripheral surface of the discharge port 29 of the body portion 21, and a male screw is formed on an outer peripheral surface of one end portion 16a of the second pipe connector 16. The second pipe connector 16 is attached to the body portion 21 by screwing the one end portion 16a from the rear side into the discharge port 29. The second pipe 6 for discharging the refrigerant R from the flow path 24 is connected to the second pipe connector 16. The second pipe connector 16 is a connector that the second pipe 6 is attachable to and detachable from. The second pipe 6 has flexibility. The material of the second pipe 6 is, for example, nylon, polyurethane, fluorine resin, or the like. In the present embodiment, the second pipe connector 16 is a connector that an end portion (end portion having flexibility) on a second pipe connector 16 side of the second pipe 6 is attachable to and detachable from. Incidentally, the end portion on the second pipe connector 16 side of the second pipe 6 may be provided with a connection portion that is attachable to and detachable from the second pipe connector 16.

As illustrated in FIGS. 2 to 4, the Peltier element 12 includes an element unit 41 and a pair of wirings 42. The element unit 41 has a heat absorption area 41a and a heat generation area 41b. The element unit 41 is disposed on a recessed portion 21e such that the heat generation area 41b is in contact with a bottom surface of the recessed portion 21e and the pair of wirings 42 extend from the element unit 41 to the rear side. The recessed portion 21e is a counterbore portion formed in the surface 21a of the body portion 21. By disposing the element unit 41 on the recessed portion 21e, the element unit 41 is positioned with respect to the body portion 21 in each of the X-axis direction, the Y-axis direction, and the Z-axis direction. The pair of wirings 42 are connected to a power supply (not illustrated).

The installation member 13 is attached to the heat sink 11 such that the Peltier element 12 is disposed between the heat sink 11 and the installation member 13. The installation member 13 includes an intermediate portion 51, a front portion 52, and a rear portion 53. The intermediate portion 51, the front portion 52, and the rear portion 53 are integrally made of, for example, aluminum.

The intermediate portion 51 has a surface (first surface) 51a and a back surface 51b perpendicular to the Y-axis direction. The front portion 52 has a surface (second surface) 52a and a back surface 52b perpendicular to the Y-axis direction. The rear portion 53 has a surface 53a and a back surface 53b perpendicular to the Y-axis direction. The back surface 51b of the intermediate portion 51 is in contact with the heat absorption area 41a of the Peltier element 12. The back surface 52b of the front portion 52 is close to the first area A1 of the heat sink 11. The back surface 53b of the rear portion 53 is close to the first area A1 of the heat sink 11. The surface 51a of the intermediate portion 51 and the surface 53a of the rear portion 53 are located on the same plane. The surface 52a of the front portion 52 is located on a heat sink 11 side with respect to the surfaces 51a and 53a. Namely, the installation member 13 has the surface 51a and the surface 52a parallel to the first area A1, and the surface 52a is located at a lower position than the surface 51a.

The installation member 13 is screwed to the body portion 21 in the first area A1. In the present embodiment, a plurality of screw holes 21f are formed in the body portion 21 so as to open to at least the surface 21a, and a plurality of clearance holes 52c and 53c are formed in the front portion 52 and the rear portion 53, respectively, so as to correspond to the plurality of screw holes 21f. The installation member 13 is attached to the body portion 21 by screwing a bolt 54 from a side opposite the body portion 21 through one of the clearance holes 52c or one of the clearance holes 53c into one of the screw holes 21f. Incidentally, a plurality of heat insulation washers (not illustrated) are disposed between the first area A1 and the back surface 52b of the front portion 52 and between the first area A1 and the back surface 53b of the rear portion 53, and one of the bolts 54 passes through one of the heat insulation washers. The material of each heat insulation washer is, for example, resin. Accordingly, the installation member 13 is thermally connected to the heat absorption area 41a of the Peltier element 12 in a state where the installation member 13 is thermally disconnected from the heat sink 11.

Figure 7:
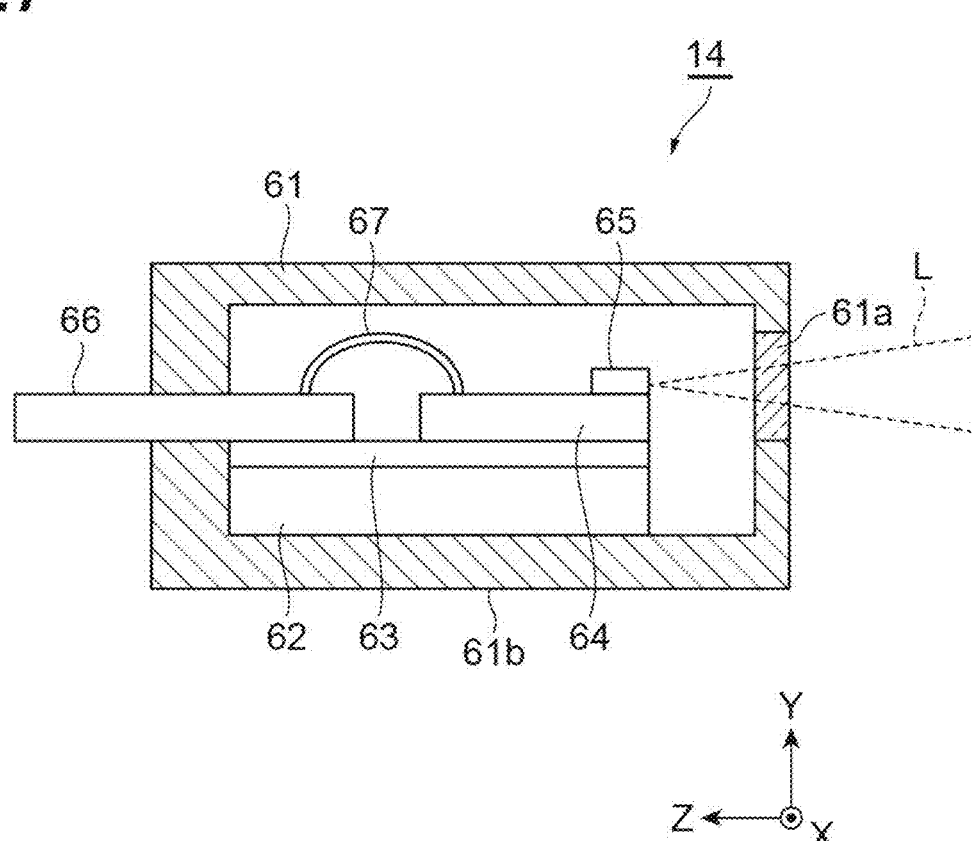
FIG. 7 is a partial configuration view of a semiconductor laser module illustrated in FIG. 3.

The semiconductor laser module 14 is attached to the installation member 13 such that the installation member 13 is disposed between the installation member 13 is disposed between the heat sink 11 and the semiconductor laser module 14. In the present embodiment, the center in the Z-axis direction of the semiconductor laser module 14 is located on the front side with respect to the center in the Z-axis direction of the heat sink 11. As illustrated in FIG. 7, the semiconductor laser module 14 includes a housing 61, a support member 62, an insulation member 63, a wiring substrate 64, a semiconductor laser element 65, a pair of electrode pins 66, and a pair of wires 67. The housing 61 airtightly accommodates the support member 62, the insulation member 63, the wiring substrate 64, and the semiconductor laser element 65. A side wall portion on the front side of the housing 61 is provided with a window member 61a that transmits the laser light L emitted from the semiconductor laser element 65. A remaining portion of the housing 61 excluding the window member 61a is, for example, formed in a rectangular parallelepiped box shape by copper. The window member 61a is, for example, formed in a circular plate shape by sapphire.

The support member 62 is fixed onto a wall portion on an installation member 13 side (refer to FIG. 3) of the housing 61. The insulation member 63 is fixed onto the support member 62. The wiring substrate 64 is fixed onto the insulation member 63. The semiconductor laser element 65 is mounted on the wiring substrate 64 to face the window member 61a in the Z-axis direction. The pair of electrode pins 66 are fixed onto the insulation member 63 to extend to the rear side, and penetrates through a wall portion on the rear side of the housing 61. The pair of electrode pins 66 airtightly penetrates through the wall portion in a state where the electrode pins 66 are electrically insulated from the wall portion. The pair of wires 67 are suspended between the wiring substrate 64 and the pair of electrode pins 66. Accordingly, the pair of electrode pins 66 are electrically connected to the semiconductor laser element 65. The pair of electrode pins 66 are connected to the power supply (not illustrated) via a pair of wirings (not illustrated).

As illustrated in FIGS. 2 to 4, a pair of attachment portions 68 are integrally formed on the housing 61. The pair of attachment portions 68 are provided on both sides in the X-axis direction of the housing 61 such that a back surface 61b of the housing 61 and a back surface 68a of each attachment portion 68 are located on the same plane. The back surface 61b of the housing 61 and the back surface 68a of each attachment portion 68 are in contact with the surface 51a of the intermediate portion 51 of the installation member 13. The housing 61 is screwed to the intermediate portion 51 on the surface 51a of the intermediate portion 51. In the present embodiment, a plurality of screw holes 51c are formed in the intermediate portion 51 so as to open to at least the surface 51a, and a plurality of clearance holes 68b are formed in the pair of attachment portions 68 so as to correspond to the plurality of screw holes 51c. The housing 61 is attached to the intermediate portion 51 by screwing a bolt 69 from a side opposite the installation member 13 through one of the clearance holes 68b into one of the screw holes 51c.

The semiconductor laser module 14 further includes a support member 71, a holder 72, and a lens 73. The lens 73 is attached within the holder 72 having a cylindrical shape, and the holder 72 is attached to the support member 71. Namely, the support member 71 supports the lens 73.

The support member 71 includes an attachment portion 74 and a support portion 75. The attachment portion 74 is a plate-shaped portion taking a thickness direction as the Y-axis direction. The support portion 75 is a plate-shaped portion taking a thickness direction as the Z-axis direction. The support portion 75 is erected along an end portion on the rear side of the attachment portion 74. The attachment portion 74 and the support portion 75 are integrally made of, for example, aluminum.

The attachment portion 74 has a back surface 74a perpendicular to the Y-axis direction. The back surface 74a is a surface on the heat sink 11 side of the attachment portion 74. The back surface 74a is in contact with the surface 52a of the front portion 52 of the installation member 13. The support portion 75 has a rear surface 75a perpendicular to the Z-axis direction. The rear surface 75a is a surface on the housing 61 side of the support portion 75. The rear surface 75a is in contact with a front surface 51d of the intermediate portion 51 of the installation member 13. The front surface 51d is a surface formed by a step difference between the surface 51a of the intermediate portion 51 and the surface 52a of the front portion 52, and is a surface perpendicular to the Z-axis direction. The support member 71 is screwed to the front portion 52 on the surface 52a of the front portion 52. In the present embodiment, a plurality of clearance holes 74b are formed in the attachment portion 74 so as to correspond to the plurality of clearance holes 52c formed in the front portion 52. The support member 71 is attached to the front portion 52 by screwing one bolt 54 from an opposite side of the heat sink 11 from the body portion 21 through one of the clearance holes 74b and one of the clearance holes 52c into one of the screw holes 21f.

The holder 72 is disposed in an opening 75b formed in the support portion 75, in a state where the holder 72 holds the lens 73. A screw hole 75c is formed in the support portion 75. The screw hole 75c reaches from an end surface on an opposite side of the support portion 75 from the attachment portion 74 to an inner surface of the opening 75b. The holder 72 is fixed to the support portion 75 by a set screw 76 screwed into the screw hole 75c. An optical axis of the lens 73 coincides with an optical axis of the semiconductor laser element 65 (refer to FIG. 7). The lens 73 is a condenser lens that condenses the laser light L emitted from the semiconductor laser element 65 at an emission angle of several degrees to several tens of degrees, onto the workpiece W (refer to FIG. 1).

As described above, the installation member 13 is screwed to the body portion 21 of the heat sink 11 in the first area A1, and the housing 61 is screwed to the intermediate portion 51 of the installation member 13 on the surface 51a of the intermediate portion 51. Namely, the housing 61 is screwed to the heat sink 11 in the first area A1 with the installation member 13 interposed therebetween. In addition, as described above, the installation member 13 is screwed to the body portion 21 of the heat sink 11 in the first area A1, and the support member 71 is screwed to the front portion 52 of the installation member 13 on the surface 52a of the front portion 52. Namely, the support member 71 is screwed to the heat sink 11 in the first area A1 with the installation member 13 interposed therebetween. As described above, the semiconductor laser module 14 including the housing 61 and the support member 71 is screwed to the heat sink 11 in the first area A1. In the laser irradiation head 10, since the plurality of screw holes 21f are formed in the side wall portion 26 of the body portion 21 of the heat sink 11, the semiconductor laser module 14 is screwed to the side wall portion 26 in the first area A1.

Incidentally, in this specification, "a first configuration (portion, member, module, connector, or the like) being screwed to a second configuration (portion, member, or the like) in an area (including a surface and the like)" means that the first configuration is directly (without another member being interposed therebetween) or indirectly (with another member interposed therebetween) attached to the second configuration by means using a screw in a state where the first configuration is located within the area or on the area (the first configuration may be in contact with the area or the first configuration may be apart from the area). Here, as the means using a screw, it is possible to select any combination of options selected from a bolt, a nut, a female screw formed on the first configuration, a male screw formed on the first configuration, a female screw formed on the second configuration, a male screw formed on the second configuration, and the like.

In the laser irradiation head 10 configured as described above, when the laser light L is emitted from the semiconductor laser element 65, heat is generated from the semiconductor laser element 65. The heat generated from the semiconductor laser element 65 is transferred through the housing 61 to the installation member 13, and is collected in the heat absorption area 41a of the Peltier element 12. The heat discharged from the heat generation area 41b of the Peltier element 12 is transferred to the heat sink 11, and is collected by the refrigerant R flowing through the flow path 24 including, for example, between the protrusion portions 27 adjacent to each other.

As described above, in the laser irradiation head 10, the semiconductor laser module 14, the first pipe connector 15, and the second pipe connector 16 are screwed to the heat sink 11. Accordingly, when the laser irradiation head 10 is attached to the moving mechanism 7 such as a robot arm and is used, the semiconductor laser module 14, the first pipe connector 15, and the second pipe connector 16 can be prevented from unexpectedly falling off from the heat sink 11. Further, the second area A2 in which the first pipe connector 15 and the second pipe connector 16 are screwed to the heat sink 11 is in a relationship of intersecting with the first area A1 in which the semiconductor laser module 14 is screwed to the heat sink 11. Accordingly, it is possible to spatially efficiently dispose the semiconductor laser module 14, the first pipe connector 15, and the second pipe connector 16 on the heat sink 11 while reducing the size of the heat sink 11. As described above, the laser irradiation head 10 is suitable for applications in which the laser irradiation head 10 is attached to the moving mechanism 7 and is used.

By screwing the semiconductor laser module 14, the first pipe connector 15, and the second pipe connector 16 (referred to as "the semiconductor laser module 14 and the like") to the heat sink 11, the following effects are also obtained. Namely, even when the screwing of the semiconductor laser module 14 and the like to the heat sink 11 is loosened, the looseness progresses gradually, so that abnormalities appear in a stepwise manner, such as the output of the laser light L decreasing gradually. Therefore, before the semiconductor laser module 14 and the like fall off from the heat sink 11, the probability of the looseness appearing increases. Hence, compared to the case where the semiconductor laser module 14 and the like unexpectedly fall off from the heat sink 11, damage to the laser irradiation device 1 can be suppressed to a low level. In addition, by screwing the semiconductor laser module 14 and the like to the heat sink 11, maintenance is also made easier.

In the laser irradiation head 10, the heat sink 11 includes the body portion 21 having the first area A1 and the second area A2, and the lid portion 22, the body portion 21 includes the recessed portion 23 that includes the flow path 24 and opens opposite the first area A1, and the lid portion 22 is attached to the body portion 21 to close the opening portion 23a of the recessed portion 23. Accordingly, maintenance of the flow path 24 can be performed in a state where the semiconductor laser module 14, the first pipe connector 15, and the second pipe connector 16 are screwed to the body portion 21 of the heat sink 11.

In the laser irradiation head 10, the body portion 21 includes the bottom wall portion 25 and the side wall portion 26 defining the recessed portion 23, and the protrusion portions 27 protruding from the bottom wall portion 25 into the recessed portion 23, and the bottom wall portion 25, the side wall portion 26, and the protrusion portions 27 are integrally formed. Accordingly, since heat is easily transferred between the bottom wall portion 25, the side wall portion 26, and the protrusion portions 27, the cooling effect of the semiconductor laser module 14 screwed to the body portion 21 can be improved.

In the laser irradiation head 10, the semiconductor laser module 14 is screwed to the side wall portion 26 of the body portion 21 in the first area A1. Accordingly, the stability of the screwing of the semiconductor laser module 14 to the body portion 21 can be improved.

In the laser irradiation head 10, the semiconductor laser module 14 includes the housing 61 accommodating the semiconductor laser element 65, and the support member 71 supporting the lens 73. Accordingly, the degree of freedom in designing the lens 73 with respect to the semiconductor laser element 65 can be improved.

In the laser irradiation head 10, the housing 61 and the support member 71 are screwed to the heat sink 11 in the first area A1 with the installation member 13 interposed therebetween. Accordingly, for example, compared to a configuration in which the housing 61 and the support member 71 are disposed as separate members, it is possible to easily and accurately align the optical axis of the semiconductor laser element 65 and the optical axis of the lens 73 with each other. Namely, the heights of the semiconductor laser element 65 and the lens 73 can be adjusted only with the processing accuracy of the installation member 13.

In the laser irradiation head 10, the installation member 13 has the surface 51a and the surface 52a parallel to the first area A1, and the surface 52a is located at a lower position than the surface 51a. Then, the housing 61 is disposed on the surface 51a, and the support member 71 is disposed on the surface 52a. Accordingly, for example, when the size of the lens 73 is large, it is possible to easily and accurately align the optical axis of the semiconductor laser element 65 and the optical axis of the lens 73 with each other.

In the laser irradiation head 10, the Peltier element 12 is disposed between the heat sink 11 and the installation member 13. Accordingly, by releasing heat from the Peltier element 12 to the heat sink 11, the semiconductor laser module 14 can be cooled such that the temperature of the semiconductor laser element 65 becomes constant.

In the laser irradiation head 10, the center in the Z-axis direction (direction parallel to the emission direction of the laser light L) of the semiconductor laser module 14 is located on the front side (side from which the laser light L emitted) with respect to the center in the Z-axis direction of the heat sink 11. Accordingly, a space can be provided behind the semiconductor laser module 14 on the heat sink 11, and for example, the power supply for the semiconductor laser element 65 can be disposed in the space. In addition, the processing of screw holes in the heat sink 11 also becomes easier.

According to the laser irradiation device 1 including the laser irradiation head 10 described above, it is possible to realize suitable laser irradiation.

The present disclosure is not limited to the embodiment. The laser irradiation head 10 may not include the Peltier element 12. Even in that case, heat generated from the semiconductor laser element 65 is transferred through the housing 61 and the installation member 13 to the heat sink 11, and is collected by the refrigerant R flowing through the flow path 24.

The laser irradiation head 10 may not include the Peltier element 12 and the installation member 13. In the laser irradiation head 10 illustrated in FIG. 8, the housing 61 and the support member 71 are directly screwed to the heat sink 11 in the first area A1. Accordingly, for example, compared to the configuration in which the housing 61 and the support member 71 are disposed as separate members, it is possible to easily and accurately align the optical axis of the semiconductor laser element 65 and the optical axis of the lens 73 with each other while simplifying the structure. Namely, the heights of the semiconductor laser element 65 and the lens 73 can be adjusted only with the processing accuracy of the heat sink 11.

Figure 8:
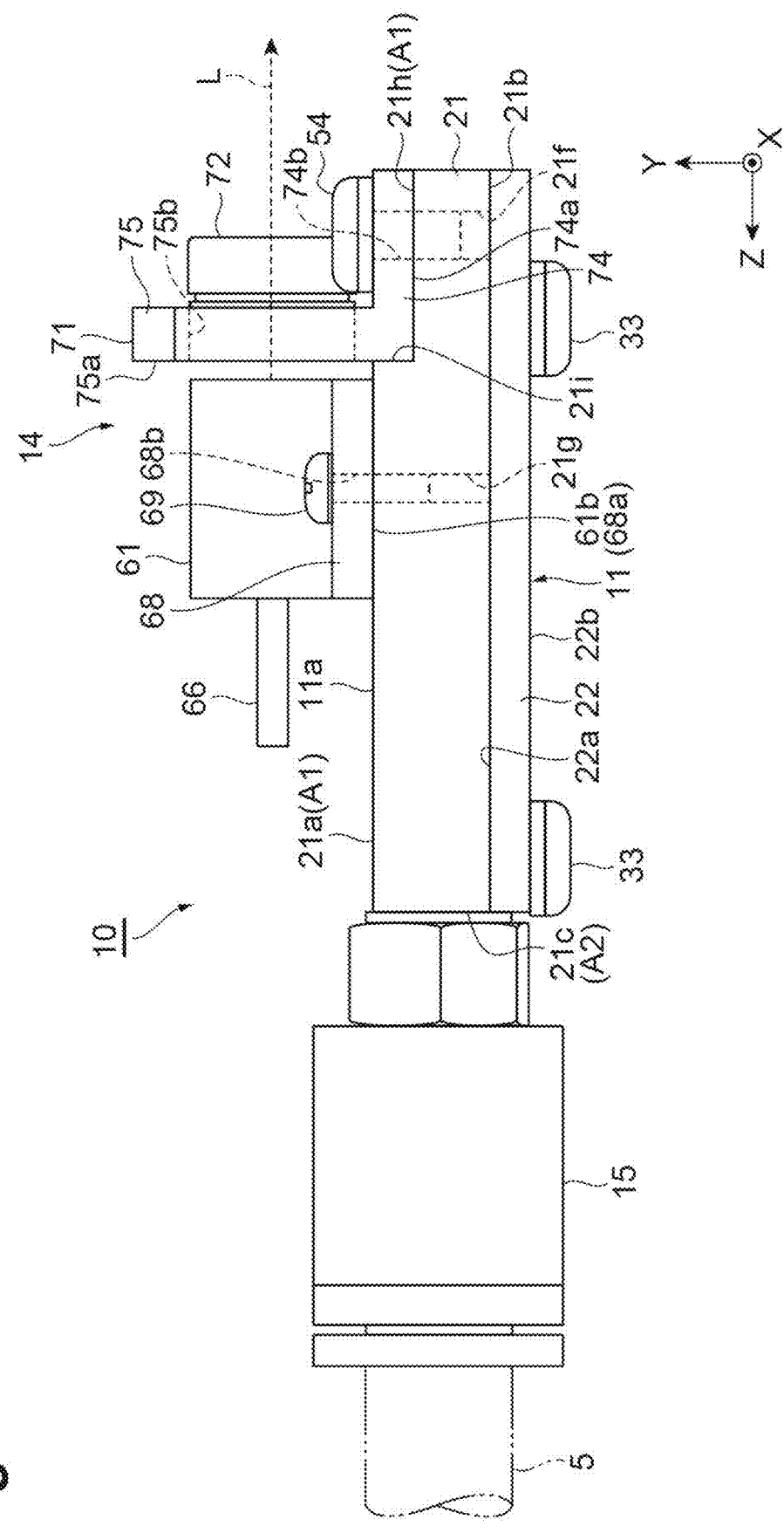
FIG. 8 is a side view of a laser irradiation device of a modification example.

Here, a configuration of the laser irradiation head 10 illustrated in FIG. 8 will be described. As illustrated in FIG. 8, the back surface 61b of the housing 61 and the back surface 68a of each attachment portion 68 are in contact with the surface (third surface) 21a of the body portion 21. A plurality of screw holes 21g are formed in the body portion 21 so as to open to at least the surface 21a. The housing 61 is attached to the body portion 21 by screwing a bolt 69 from the side opposite the body portion 21 through one of the clearance holes 68b into one of the screw holes 21g. In such a manner, the housing 61 is screwed to the body portion 21 on the surface 21a that is the first area A1.

The back surface 74a of the attachment portion 74 of the support member 71 is in contact with a surface (fourth surface) 21h of the body portion 21. The surface 21h is a surface perpendicular to the Y-axis direction, and is located on a lid portion 22 side with respect to the surface 21a. The rear surface 75a of the support portion 75 of the support member 71 is in contact with a front surface 21i of the body portion 21. The front surface 21i is a surface formed by a step difference between the surface 21a and the surface 21h, and is a surface perpendicular to the Z-axis direction. The support member 71 is attached to the body portion 21 by screwing one bolt 54 from the side opposite the body portion 21 through one of the clearance holes 74b into one of the screw holes 21f. In such a manner, the support member 71 is screwed to the body portion 21 on the surface 21h that is the first area A1. In the laser irradiation head 10 illustrated in FIG. 8, the heat sink 11 has the surface 21a and the surface 21h that are the first area A1, and the surface 21h is located at a lower position than the surface 21a. Then, the housing 61 is disposed on the surface 21a, and the support member 71 is disposed on the surface 21h. Accordingly, for example, when the size of the lens 73 is large, it is possible to easily and accurately align the optical axis of the semiconductor laser element 65 and the optical axis of the lens 73 with each other.

Figure 9:
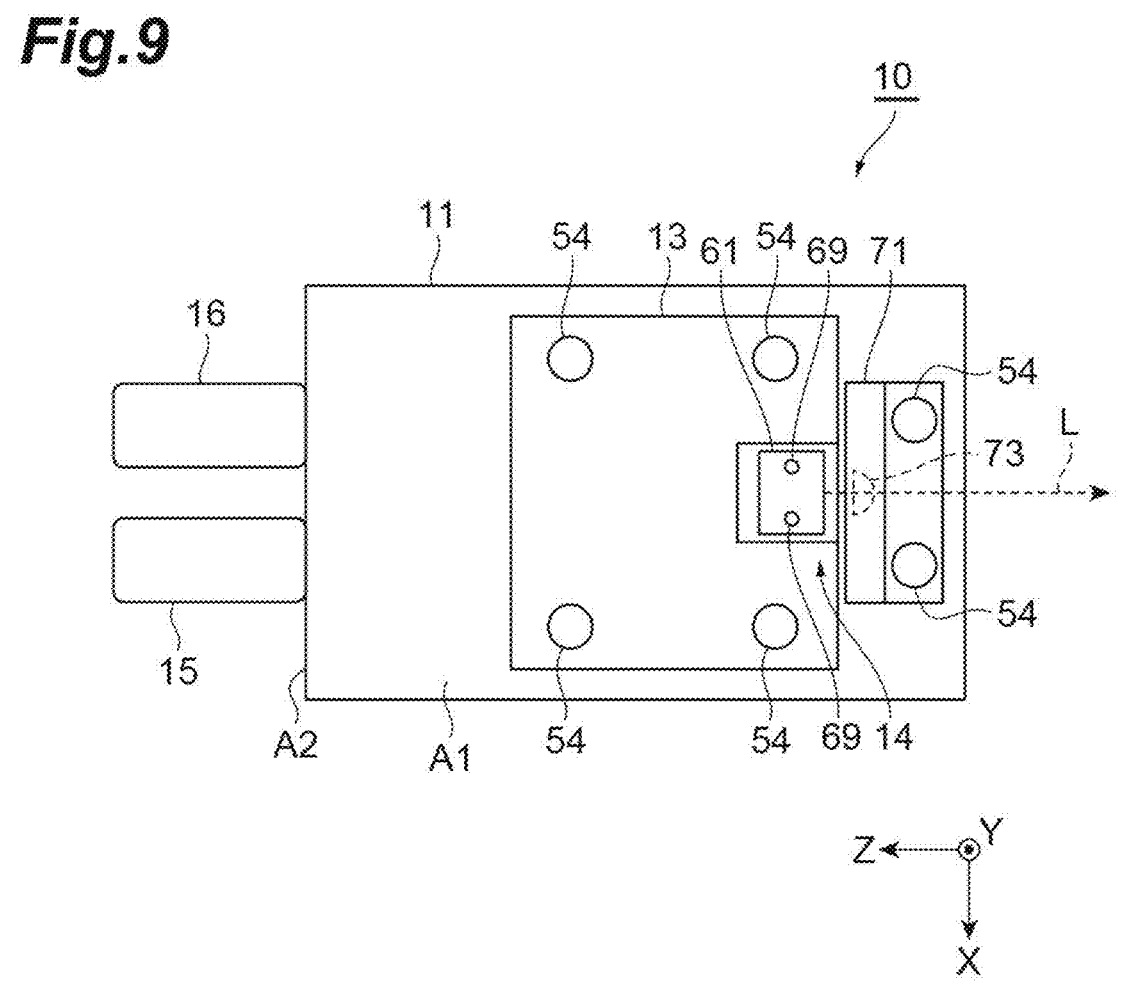
Figure 10:
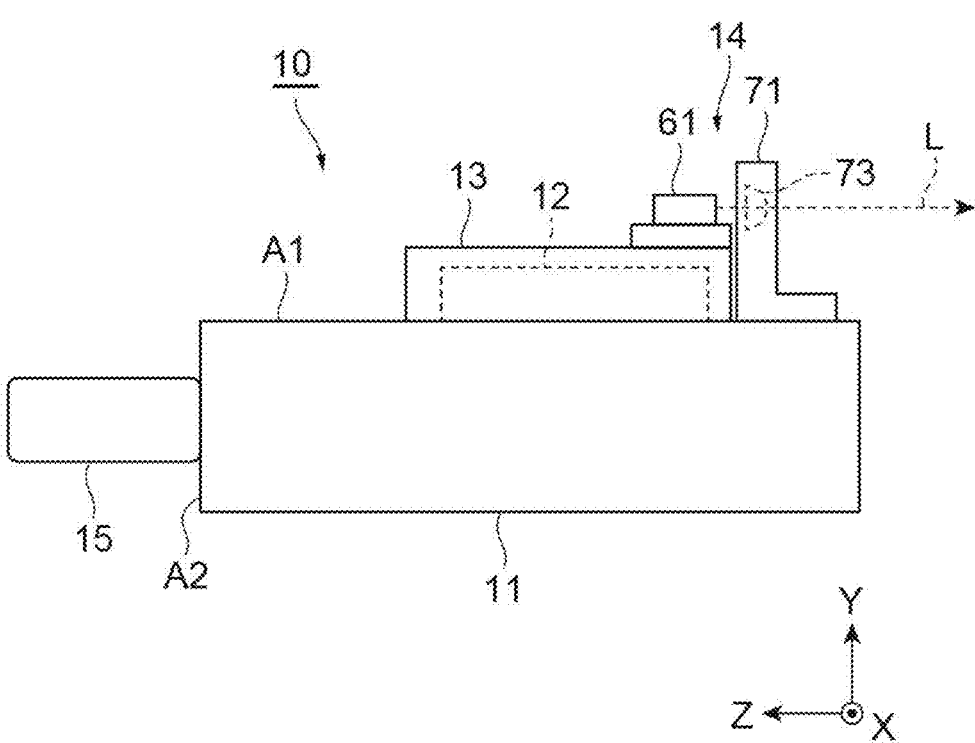
FIG. 10 is a side view of the laser irradiation device illustrated in FIG. 9.

As illustrated in FIGS. 9 and 10, by attaching the housing 61 to the heat sink 11 with the installation member 13 interposed therebetween and by attaching the support member 71 to the heat sink 11 without the installation member 13 interposed therebetween, the semiconductor laser module 14 may be screwed to the heat sink 11 in the first area A1. According to this configuration, the Peltier element 12 can be interposed between the installation member 13 and the heat sink 11. In addition, it is possible to easily align the optical axis of the semiconductor laser element 65 and the optical axis of the lens 73 with each other.

Figure 11:
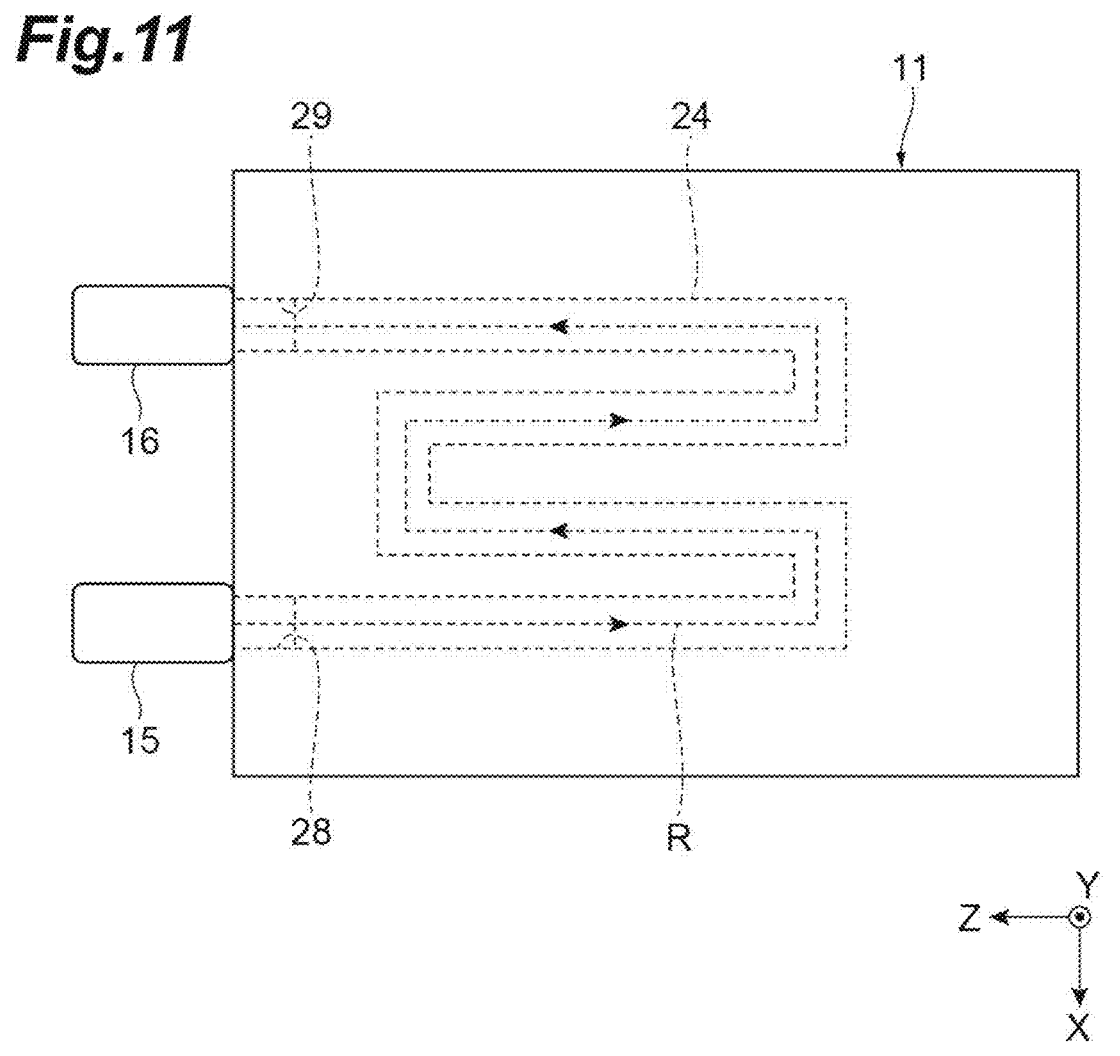

In the heat sink 11, the protrusion portions 27 protruding from the bottom wall portion 25 into the recessed portion 23 may have the function of heat dissipation fins, or may have the function of defining the flow path 24. In addition, as illustrated in FIG. 11, for example, by embedding a heat pipe or the like in the heat sink 11, the flow path 24 of the refrigerant R may be formed in the heat sink 11. In addition, the refrigerant R is not limited to air, and may be another gas such as an inert gas or may be a liquid such as water.

However, in the case where the refrigerant R is air, even when the refrigerant R leaks from the heat sink 11, it is possible to prevent the workpiece W and the like from being contaminated by the refrigerant R. In addition, in the case where the refrigerant R is air, the refrigerant R may not have to return from the flow path 24 to the refrigerant supply source 4 through the second pipe connector 16 and the second pipe 6. In addition, in the laser irradiation device 1, the refrigerant R may be supplied in a circulating manner while being cooled.

Figure 12:
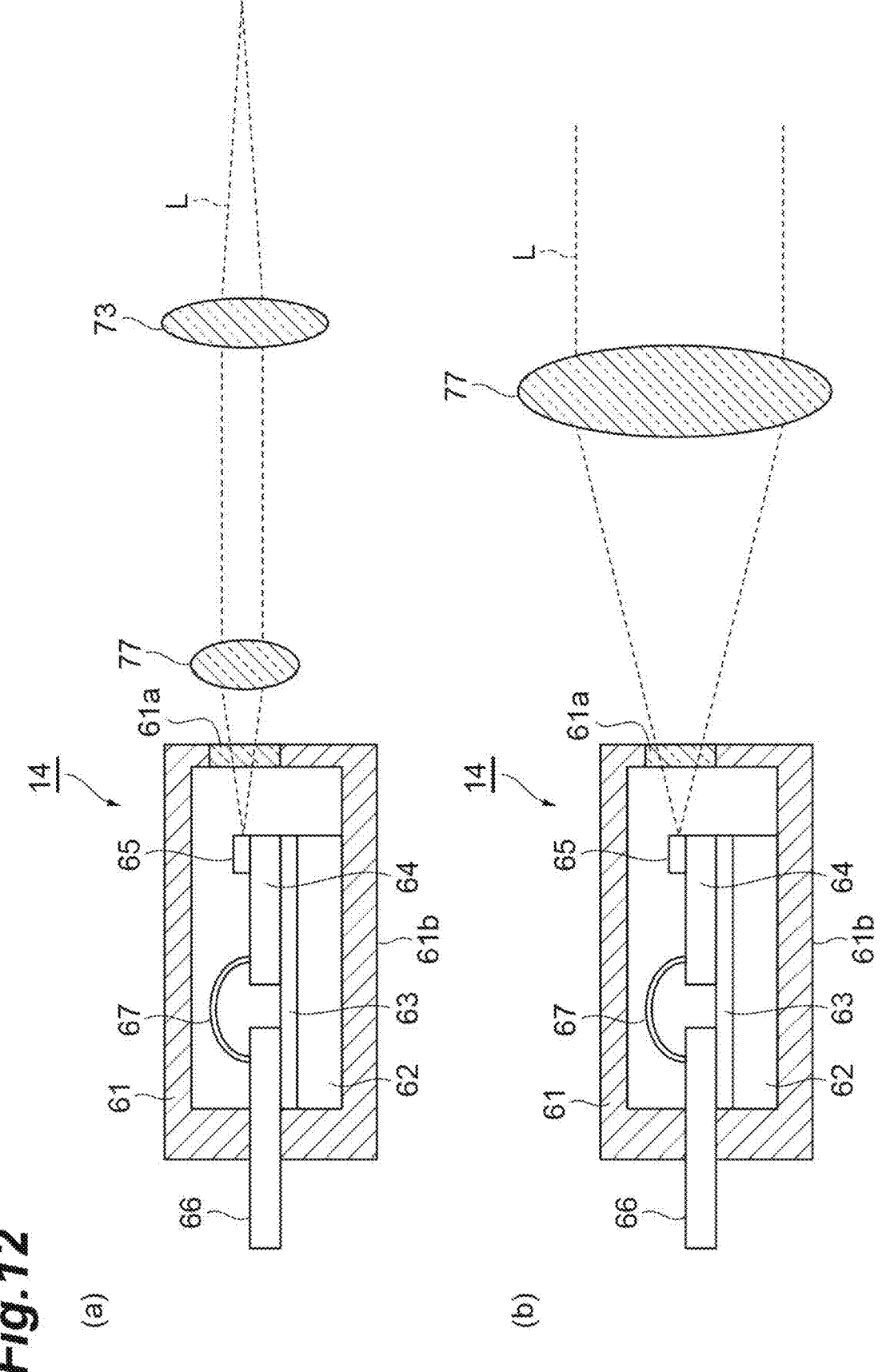
FIG. 12 is a configuration view of a semiconductor laser module of a modification example.

As illustrated in (a) of FIG. 12, in the semiconductor laser module 14, a lens 77 that is a collimating lens may be disposed between the housing 61 accommodating the semiconductor laser element 65 and the lens 73 being a condenser lens. In addition, as illustrated in (b) of FIG. 12, in the semiconductor laser module 14, the lens 77 that is a collimating lens may be disposed instead of the lens 73 that is a condenser lens. In (a) and (b) of FIG. 12, the support member 71 that supports at least one of the lenses 73 and 77 is not illustrated; however, by supporting at least one of the lenses 73 and 77 on the support member 71 separate from the housing 61, the degree of freedom in designing the lens 73 with respect to the semiconductor laser element 65 can be improved.

Figure 13:
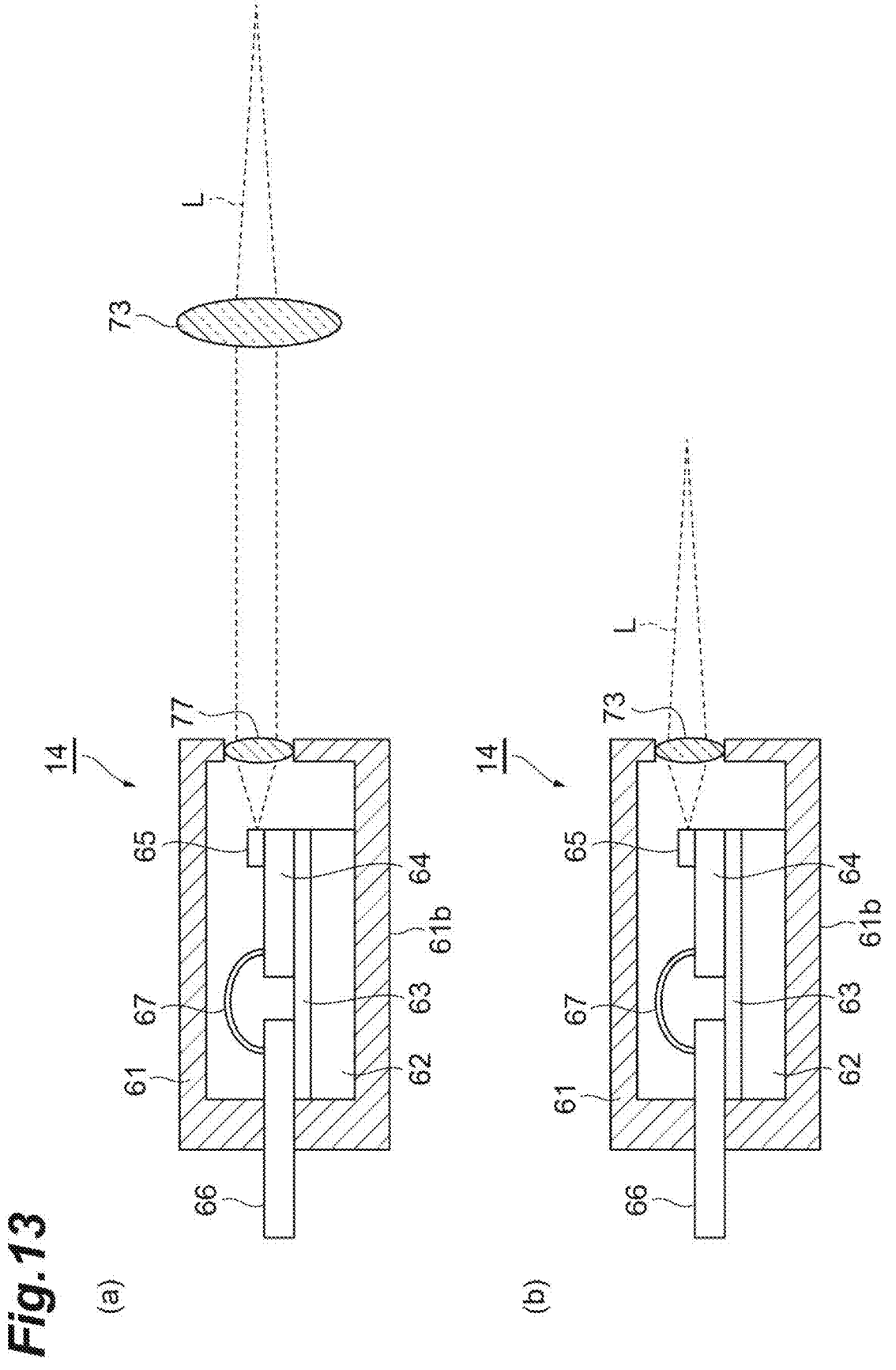
FIG. 13 is a configuration view of a semiconductor laser module of a modification example.

As illustrated in (a) of FIG. 13, in the semiconductor laser module 14, instead of the window member 61a (refer to FIG. 7), the lens 77 that is a collimating lens may be disposed on the housing 61 accommodating the semiconductor laser element 65. In addition, as illustrated in (b) of FIG. 13, in the semiconductor laser module 14, instead of the window member 61a (refer to FIG. 7), the lens 73 that is a condenser lens may be disposed on the housing 61 accommodating the semiconductor laser element 65. According this configuration, the configuration of the support member 71 that supports at least one of the lenses 73 and 77 can be simplified, and the support member 71 can be omitted.

The semiconductor laser module 14 may include a plurality of the semiconductor laser elements 65 (for example, a semiconductor laser element array or the like). In addition, a heat spreader such as a carbon graphite sheet may be disposed between members that are thermally connected to each other. In addition, the power supply for the semiconductor laser element 65 may be mounted on the laser irradiation head 10.

REFERENCE SIGNS LIST

1: laser irradiation device, 4: refrigerant supply source, 5: first pipe, 6: second pipe, 7: moving mechanism, 10: laser irradiation head, 11: heat sink, 11a: outer surface, 12: peltier element, 13: installation member, 14: semiconductor laser module, 15: first pipe connector, 16: second pipe connector, 21: body portion, 21a: surface (third surface), 21h: surface (fourth surface), 22: lid portion, 23: recessed portion, 23a: opening portion, 24: flow path, 25: bottom wall portion, 26: side wall portion, 27: protrusion portion, 51a: surface (first surface), 52a: surface (second surface), 61: housing, 65: semiconductor laser element, 71: support member, 73, 77: lens, A1: first area, A2: second area, R: refrigerant.

The invention claimed is:
1. A laser irradiation head comprising:
a semiconductor laser module including a semiconductor laser element and a lens;
a heat sink having a flow path of a refrigerant; and a first pipe connector that a first pipe for supplying the refrigerant to the flow path is attachable to and detachable from,
wherein the heat sink has an outer surface including a first area and a second area being in a relationship of intersecting with the first area,
the semiconductor laser module is screwed to the heat sink in the first area,
the first pipe connector is screwed to the heat sink in the second area,
the semiconductor laser module is configured to emit laser light, in a direction along the first area, toward a side opposite to the second area, and
the first pipe connector extends along a direction intersecting the second area, and is configured such that the first pipe is attachable to and detachable from the first pipe connector from a side opposite to the heat sink in the direction intersecting the second area.
2. The laser irradiation head according to claim 1, further comprising:
a second pipe connector that a second pipe for discharging the refrigerant from the flow path is attachable to and detachable from,
wherein the second pipe connector is screwed to the heat sink in the second area.
3. The laser irradiation head according to claim 1,
wherein the heat sink includes a body portion having the first area and the second area, and a lid portion,
the body portion has a recessed portion including the flow path and opening opposite the first area, and
the lid portion is attached to the body portion to close an opening portion of the recessed portion.
4. The laser irradiation head according to claim 3,
wherein the body portion includes a bottom wall portion and a side wall portion defining the recessed portion, and a protrusion portion protruding from the bottom wall portion into the recessed portion, and
the bottom wall portion, the side wall portion, and the protrusion portion are integrally formed.
5. The laser irradiation head according to claim 4,
wherein the semiconductor laser module is screwed to the side wall portion in the first area.
6. The laser irradiation head according to claim 1,
wherein the semiconductor laser module further includes a housing accommodating the semiconductor laser element, and a support member supporting the lens.
7. The laser irradiation head according to claim 6,
wherein the housing and the support member are directly screwed to the heat sink in the first area.
8. The laser irradiation head according to claim 7,
wherein the heat sink has a third surface and a fourth surface being the first area,
the fourth surface is located at a lower position than the third surface,
the housing is disposed on the third surface, and
the support member is disposed on the fourth surface.
9. A laser irradiation device comprising:
the laser irradiation head according to claim 1;
the first pipe having flexibility and connected to the first pipe connector;
a refrigerant supply source configured to supply the refrigerant to the flow path through the first pipe; and
a moving mechanism configured to move the laser irradiation head.
10. A laser irradiation head comprising:
a semiconductor laser module including a semiconductor laser element and a lens;

15 a heat sink having a flow path of a refrigerant;

a first pipe connector that a first pipe for supplying the refrigerant to the flow path is attachable to and detachable from; and an installation member disposed between the heat sink and the semiconductor laser module, wherein the heat sink has an outer surface including a first area and a second area being in a relationship of intersecting with the first area, the semiconductor laser module is screwed to the heat sink in the first area, the first pipe connector is screwed to the heat sink in the second area, the semiconductor laser module further includes a housing accommodating the semiconductor laser element, and a support member supporting the lens, and the housing and the support member are screwed to the heat sink in the first area with the installation member interposed therebetween.

11. The laser irradiation head according to claim 10, wherein the installation member has a first surface and a second surface parallel to the first area, the second surface is located at a lower position than the first surface, the housing is disposed on the first surface, and the support member is disposed on the second surface.

12. The laser irradiation head according to claim 10, further comprising:

a Peltier element disposed between the heat sink and the installation member.

\* \* \* \* \*